US012237665B2

(12) United States Patent
Li et al.

(10) Patent No.: US 12,237,665 B2
(45) Date of Patent: Feb. 25, 2025

(54) LEAKAGE CURRENT DETECTION AND INTERRUPTION DEVICE FOR POWER CORD AND RELATED ELECTRICAL CONNECTORS AND ELECTRICAL APPLIANCES

(71) Applicant: Chengli Li, Suzhou (CN)

(72) Inventors: Chengli Li, Suzhou (CN); Long Chen, Suzhou (CN)

(73) Assignee: Chengli Li, Suzhou (CN)

( * ) Notice: Subject to any disclaimer, the term of this patent is extended or adjusted under 35 U.S.C. 154(b) by 211 days.

(21) Appl. No.: 18/173,655

(22) Filed: Feb. 23, 2023

(65) Prior Publication Data

US 2023/0268730 A1 Aug. 24, 2023

Related U.S. Application Data

(63) Continuation-in-part of application No. 17/682,598, filed on Feb. 28, 2022, now Pat. No. 11,600,984.

(30) Foreign Application Priority Data

| Feb. 23, 2022 | (CN) | 202210166502.6 |
| Feb. 23, 2022 | (CN) | 202220368421.X |
| Feb. 21, 2023 | (CN) | 202320263807.9 |

(51) Int. Cl.
*H02H 3/32* (2006.01)
*G01R 31/52* (2020.01)
*H02H 1/00* (2006.01)

(52) U.S. Cl.
CPC .............. *H02H 3/32* (2013.01); *G01R 31/52* (2020.01); *H02H 1/0007* (2013.01)

(58) Field of Classification Search
CPC ......... H02H 3/32; H02H 1/0007; G01R 31/52
See application file for complete search history.

(56) References Cited

U.S. PATENT DOCUMENTS

| 4,707,759 | A | 11/1987 | Bodkin |
| 5,708,364 | A | 1/1998 | Vokey et al. |
| 6,262,871 | B1 * | 7/2001 | Nemir ............... G01R 31/327 |
| | | | 324/424 |
| 6,697,238 | B2 | 2/2004 | Bonilla et al. |

(Continued)

FOREIGN PATENT DOCUMENTS

WO    2010011321 A1    1/2010

*Primary Examiner* — Scott Bauer
(74) *Attorney, Agent, or Firm* — Chen Yoshimura LLP

(57) ABSTRACT

A leakage current detection and interruption device for a power cord includes a switch module that controls an electrical connection of first and second power supply lines because input and output ends; a leakage current detection module, including first and second leakage current detection lines, which respectively detect leakage current signals on the first and second power supply lines and generate self-test fault signals in response to the first and second leakage current detection lines having an open circuit; and a drive module including at least one solenoid, a first semiconductor device forming a first current path from the first to the second power supply line when conductive, and a second semiconductor device forming a second current path from the second to the first power supply line when conductive, to supply current to the solenoid which in turn drives the switch module to disconnect the electrical connection.

11 Claims, 4 Drawing Sheets

(56) References Cited

U.S. PATENT DOCUMENTS

| | | |
|---|---|---|
| 8,605,402 B2 | 12/2013 | Ward et al. |
| 8,853,539 B2 | 10/2014 | Ye et al. |
| 9,312,680 B2 | 4/2016 | Li et al. |
| 9,331,582 B2 | 5/2016 | Goerke |
| 9,356,402 B2 | 5/2016 | Sung et al. |
| 9,535,106 B2 | 1/2017 | Li |
| 9,547,047 B2 | 1/2017 | Li et al. |
| 9,564,119 B2 | 2/2017 | Ryu et al. |
| 9,697,926 B2 | 7/2017 | Huang et al. |
| 10,840,698 B2 | 11/2020 | Li et al. |
| 10,886,724 B2 | 1/2021 | Li et al. |
| 10,903,645 B2 * | 1/2021 | Oms .................. G01R 31/52 |
| 11,037,700 B2 * | 6/2021 | Aromin ................ H01B 13/22 |
| 11,281,070 B2 | 3/2022 | Sun et al. |
| 11,381,070 B1 | 7/2022 | Legatti |
| 11,600,984 B1 | 3/2023 | Li et al. |
| 2004/0070899 A1 * | 4/2004 | Gershen ............... H02H 3/331 |
| | | 361/42 |
| 2006/0119997 A1 | 6/2006 | Lee |
| 2006/0146456 A1 | 7/2006 | Williams |
| 2006/0198067 A1 | 9/2006 | Pearse |
| 2007/0159740 A1 | 7/2007 | Williams et al. |
| 2008/0007878 A1 | 1/2008 | Gandolfi et al. |
| 2008/0062593 A1 | 3/2008 | Li et al. |
| 2008/0099227 A1 | 5/2008 | Zhang et al. |
| 2010/0020452 A1 | 1/2010 | Gandolfi |
| 2010/0046128 A1 * | 2/2010 | Wang .................... H01H 83/14 |
| | | 361/42 |
| 2011/0061892 A1 | 3/2011 | Ye et al. |
| 2011/0273813 A1 | 11/2011 | Huang |
| 2012/0119918 A1 | 5/2012 | Williams |
| 2012/0249151 A1 | 10/2012 | Dobusch et al. |
| 2012/0257314 A1 * | 10/2012 | Armstrong ............ H02H 3/335 |
| | | 361/42 |
| 2014/0117995 A1 | 5/2014 | Topucharla |
| 2015/0009592 A1 | 1/2015 | Aromin et al. |
| 2015/0309105 A1 | 10/2015 | Ostrovsky et al. |
| 2015/0349517 A1 | 12/2015 | Li et al. |
| 2016/0111869 A1 | 4/2016 | Li et al. |
| 2017/0222425 A1 | 8/2017 | Li et al. |
| 2018/0292466 A1 | 10/2018 | Hackl et al. |
| 2019/0089074 A1 | 3/2019 | Oms |
| 2019/0097412 A1 | 3/2019 | Li et al. |
| 2019/0115748 A1 | 4/2019 | Li et al. |
| 2020/0091707 A1 | 3/2020 | Li et al. |
| 2020/0366083 A1 | 11/2020 | Li et al. |
| 2020/0393520 A1 | 12/2020 | Li et al. |
| 2021/0006060 A1 | 1/2021 | Li et al. |
| 2021/0027915 A1 | 1/2021 | Aromin et al. |
| 2021/0125746 A1 | 4/2021 | Aromin et al. |
| 2021/0125753 A1 | 4/2021 | Aromin et al. |
| 2021/0125754 A1 | 4/2021 | Aromin et al. |
| 2021/0239770 A1 | 8/2021 | Li et al. |
| 2022/0011378 A1 | 1/2022 | Li et al. |
| 2024/0063631 A1 | 2/2024 | Zou et al. |

\* cited by examiner

LEAKAGE CURRENT DETECTION AND INTERRUPTION DEVICE FOR POWER CORD AND RELATED ELECTRICAL CONNECTORS AND ELECTRICAL APPLIANCES

BACKGROUND OF THE INVENTION

Field of the Invention

This invention relates to electrical circuits, and in particular, it relates to a leakage current detection and interruption (LCDI) device for a power cord, and related electrical connectors and electrical appliances.

Description of Related Art

Leakage current detection and interruption (LCDI) device is a fire hazard prevention device for electrical appliances. Its is implemented in a power cord with a plug, and functions to detect any leakage current between the hot and neutral power supply lines and their shield layers along the power cord from the plug to the electrical load (e.g., air conditioner, dehumidifier, etc.). When a leakage current is detected, the LCDI device can disconnect the electrical power from the power source to the appliance, preventing fire hazard and ensuring safety. Thus, LCDI devices can prevent fire hazard caused by arc fault due to physical damage and lost of insulation in the power cord, which may be caused by aging of the hot, neutral and ground wires, wear, pinching, animal chewing, etc.

In some conventional LCDI devices, when the device has lost its protection function due to an open circuit condition in the leakage current detection line for the hot or neutral wire, the power cord can still output power. This is a hidden threat of fire hazard and other hazards.

SUMMARY

Therefore, there is a need for an LCDI device that can detect the proper function of the leakage current detection lines.

To achieve the above objects, the present invention provides a leakage current detection and interruption (LCDI) device for a power cord, which includes: a first power supply line and a second power supply line; a switch module, configured to control an electrical connection of the first power supply line and second power supply line between an input end and an output end; a leakage current detection module, including a first leakage current detection line and a second leakage current detection line, wherein the first leakage current detection line covers the first power supply line, and is configured to detect a first leakage current signal on the first power supply line and to generate a first self-test fault signal in response to the first leakage current detection line having an open circuit, wherein the second leakage current detection line covers the second power supply line of the power cord, and is configured to detect a second leakage current signal on the second power supply line and to generate a second self-test fault signal in response to the second leakage current detection line having an open circuit; and a drive module, coupled to the switch module and the leakage current detection module, including: at least one solenoid; and a first semiconductor device and a second semiconductor device, wherein the first semiconductor device is configured to, in response to the first leakage current signal and/or the first self-test fault signal, become conductive to form a first current path from the first power supply line to the second power supply line to supply current to the at least one solenoid, and wherein the at least one solenoid is configured to, in response to the current flowing through it, generate an electromagnetic force to drive the switch module to disconnect the electrical connection, and wherein the second semiconductor device is configured to, in response to the second leakage current signal and/or the second self-test fault signal, become conductive to form a second current path from the second power supply line to the first power supply line to supply current to the at least one solenoid, and wherein the at least one solenoid is configured to, in response to the current flowing through it, generate an electromagnetic force to drive the switch module to disconnect the electrical connection.

In some embodiments, the first semiconductor device is a first silicon controlled rectifier, the second semiconductor device is a second silicon controlled rectifier, wherein an anode of the first silicon controlled rectifier is couple to the first power supply line, a cathode of the first silicon controlled rectifier is couple to the second power supply line, an anode of the second silicon controlled rectifier is couple to the second power supply line, and a cathode of the second silicon controlled rectifier is couple to the first power supply line.

In some embodiments, the LCDI device further includes a self-test module, coupled to the leakage current detection module, the drive module, the first power supply line, and the second power supply line, and configured to: detect whether an open circuit is present on at least one of the first and second leakage current detection lines; and cooperate with the first leakage current detection line to generate the first self-test fault signal when the first leakage current detection line has an open circuit, and cooperate with the second leakage current detection line to generate a second self-test fault signal when the second leakage current detection line has an open circuit.

In some embodiments, the first leakage current detection line and second leakage current detection line are electrically insulated from each other by an insulating structure.

In some embodiments, each of the first and second semiconductor devices is selected from a group consisting of: silicon controlled rectifiers, bipolar junction transistors, field-effect transistors, and photoelectric coupling elements.

In some embodiments, the LCDI device further includes at least one test module, including a test switch coupled to the leakage current detection module, wherein the drive module is further configured to drive the switch module to disconnect the electrical connection in response to the test switch being manually operated and the leakage current detection module having no open circuit.

In some embodiments, one end of the test switch is coupled to the first leakage current detection line or the second leakage current detection line, and another end of the test switch is coupled to the first power supply line or the second power supply line.

In some embodiments, the at least one self-test module includes a first test module and a second test module, the first test module including a first test switch, the second test module including a second test switch, wherein one end of the first test switch is coupled to the first leakage current detection line and another end of the first test switch is coupled to the first power supply line, and one end of the second test switch is coupled to the second leakage current detection line and another end of the second test switch is coupled to the second power supply line.

In another aspect, the present invention provides an electrical power connection device, which includes: a body; and an LCDI device according to any of the above embodiments, disposed inside the body.

In another aspect, the present invention provides an electrical appliance, which includes: an electrical load; and an electrical power connection device coupled between a power supply and the electrical load, configured to supply power to the electrical load, wherein the electrical power connection device includes an LCDI device according to any of the above embodiments.

In the various embodiments, the two leakage current detection lines are respectively configured to form a leakage current detection path for the drive module. Thus, the device can individually detect the leakage currents on the two leakage current detection lines and to individually detect open circuit fault in the two leakage current detection lines. The LCDI devices according to embodiments of the present invention have a simple structure, and are low cost and reliable.

BRIEF DESCRIPTION OF THE DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols. In the block diagrams, lines between blocks represent electrical or magnetic coupling of the blocks; the absence of lines between blocks does not mean the lack of coupling.

DETAILED DESCRIPTION OF PREFERRED EMBODIMENTS

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc. In this disclosure, the above terms do not necessarily refer to the same embodiments. Further, the various features, structures, materials or characteristics may be suitably combined in any of the one or more embodiments. Those of ordinary skill in the art may combine the various embodiments and various characteristics of the embodiments described herein when they are not contrary to each other.

Embodiments of the present invention provide an LCDI device, where two leakage current detection lines are configured to respectively form leakage current detection loops with the drive module. Thus, the LCDI device can individually detect leakage current on the two power supply lines and individually detect open circuit conditions of the two leakage current detection lines.

Figure 1:
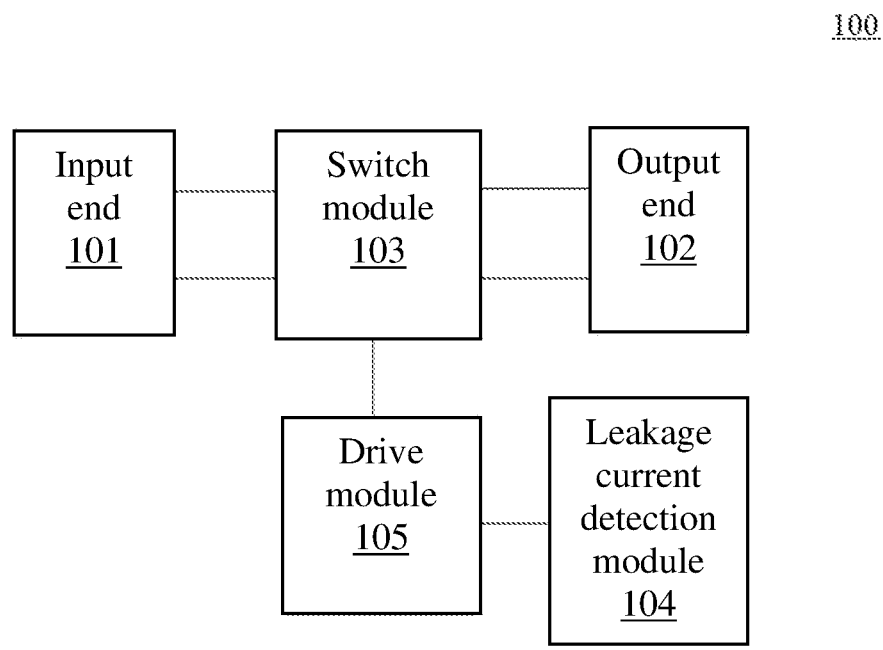
FIG. 1 is a block diagram of an LCDI device according to embodiments of the present invention.

FIG. 1 is a block diagram of an LCDI device according to embodiments of the present invention. As shown in FIG. 1, the LCDI device 100 for a power cord includes a switch module 103, a leakage current detection module 104, and a drive module 105. The switch module 103 controls the electrical connection between the input end 101 and output end 102 of the device. The power supply lines include first and second power supply lines. The leakage current detection module 104 includes a first leakage current detection line and a second leakage current detection line. The first leakage current detection line covers the first power supply line of the power cord, and functions to detect a first leakage current signal on the first power supply line or generate a first self-test fault signal when the first leakage current detection line has an open circuit condition. The second leakage current detection line covers the second power supply line of the power cord, and functions to detect a second leakage current signal on the second power supply line or generate a second self-test fault signal when the second leakage current detection line has an open circuit condition.

The drive module 105 is coupled to the switch module 103 and the leakage current detection module 104, configured to receive the first leakage current signal and/or the first self-test fault signal, and to drive the switch module 103 to disconnect the power connection in response to the first leakage current signal and/or the first self-test fault signal. The drive module 105 is further configured to receive the second leakage current signal and/or the second self-test fault signal, and to drive the switch module 103 to disconnect the power connection in response to the second leakage current signal and/or the second self-test fault signal. In other words, each of the first leakage current signal, the first self-test fault signal, the second leakage current signal, and the second self-test fault signal can trigger the drive module 105 to drive the switch module 103 to disconnect the power connection. When the first leakage current detection line detects a first leakage current signal or generates a first self-test fault signal, and/or when the second leakage current detection line detects a second leakage current signal or generates a second self-test fault signal, the detected or generated signal is provided to the drive module 105, and in response thereto, the drive module 105 drives the switch module 103 to disconnect the power connection.

More specifically, the drive module 105 includes at least one solenoid, a first semiconductor device, and a second semiconductor device. Each of the first and second semiconductor devices may be a silicon controlled rectifier (SCR), bipolar junction transistor, field-effect transistor, photoelectric coupling element, etc. The first semiconductor device is configured to become conductive in response to the first leakage current signal and/or first self-test fault signal, i.e., the first leakage current signal and/or first self-test fault signal triggers the first semiconductor device to become conductive. When the first semiconductor device is conductive, a current path is formed from the first power supply line to the second power supply line, and the solenoid is coupled in series in the current path, so a current flows through the solenoid. The current generates a sufficiently large magnetic field, which drives the switch module 103 to disconnect the electrical connection between the input end 101 and output end 102. The second semiconductor device is configured to become conductive in response to the second leakage current signal and/or second self-test fault signal, i.e., the second leakage current signal and/or second self-test fault signal triggers the second semiconductor device to become conductive. When the second semiconductor device is conductive, a current path is formed from the second power supply line to the first power supply line, and the solenoid is coupled in series in the current path, so a current flows through the solenoid. The current generates a sufficiently large magnetic field, which drives the switch module 103 to disconnect the electrical connection between the input end 101 and output end 102. The first and second semiconductor devices are connected in opposite directions between the first and second power supply lines, so that the currents flow in opposite directions when they are respectively conductive. For example, when the first semiconductor device is conductive, the current flows from the first power supply line to the second power supply line; when the second semiconductor device is conductive, the current flows from the second power supply line to the first power supply line.

In some embodiments, the drive module 105 includes only one solenoid, which is coupled in series with both the first semiconductor device and the second semiconductor device. Thus, a current flows through the solenoid when either first semiconductor device or the second semiconductor device is conductive, to drive the switch module 103 to disconnect the electrical connection between the input end 101 and output end 102.

In some embodiments, the drive module 105 includes two solenoids, the first solenoid coupled in series with the first semiconductor device and the second solenoid coupled in series with the second semiconductor device. Thus, a current flows through the first solenoid when the first semiconductor device is conductive, and a current flows through the second solenoid when the second semiconductor device is conductive, to drive the switch module 103 to disconnect the electrical connection between the input end 101 and output end 102.

Thus, in the LCDI device 100, the two leakage current detection lines respectively form a leakage current detection path with the drive module, so that the LCDI device 100 can individually detect the leakage currents on the two power supply lines and individually detect the open circuit conditions of the two leakage current detection lines.

In some embodiments, the LCDI device 100 further includes a self-test module (not shown in FIG. 1). The self-test module is coupled to the leakage current detection module 104, the drive module 105, the first power supply line, and the second power supply line, and functions to detect whether an open circuit condition is present on at least one of the first and second leakage current detection lines. When the first leakage current detection line has an open circuit condition, the self-test module cooperates with the first leakage current detection line to generate a first self-test fault signal. When the second leakage current detection line has an open circuit condition, the self-test module cooperates with the second leakage current detection line to generate a second self-test fault signal. Using the self-test module, the LCDI device can detect faults (e.g., open circuit) in the first and second leakage current detection lines, and can disconnect the power in response to such detected faults, thereby improving the reliability of the LCDI device 100.

In some embodiments, an electrical insulation structure is provided between the first and second leakage current detection lines to insulate them from each other.

In some embodiments, the LCDI device 100 further includes at least one test module (not shown in FIG. 1), which includes a test switch, coupled to the leakage current detection module 104. When the test switch is manually operated (closed or open) and the leakage current detection module 104 functions normally, the drive module 105 drives the switch module 103 to disconnect the power. When the test switch is manually operated and the leakage current detection module 104 is faulty, the switch module 103 maintains the power connection. By using the test module, the user can manually test whether the leakage current detection module 104 (e.g. the first and second leakage current detection lines) is faulty (e.g., open circuit). When the leakage current detection module 104 is faulty, the continued electrical connection will warn the user of the fault, thereby improving the reliability of the LCDI device 100.

In some embodiments, the LCDI device 100 includes one test module, with its first end coupled to the first leakage current detection line and its second end coupled to the first or second power supply line. This allows the user to manually test whether the first leakage current detection line has a fault.

In some embodiments, the LCDI device 100 includes one test module, with its first end coupled to the second leakage current detection line and its second end coupled to the first or second power supply line. This allows the user to manually test whether the second leakage current detection line has a fault.

In some embodiments, the LCDI device 100 includes a first test module and a second test module. The first test module includes a first test switch with its first end coupled to the first leakage current detection line and its second end coupled to the first power supply line. The second test module includes a second test switch with its first end coupled to the second leakage current detection line and its second end coupled to the second power supply line. This allows the user to manually operate the first test module to test whether the first leakage current detection line has a fault, and manually operate the second test module to test whether the second leakage current detection line has a fault.

Figure 2:
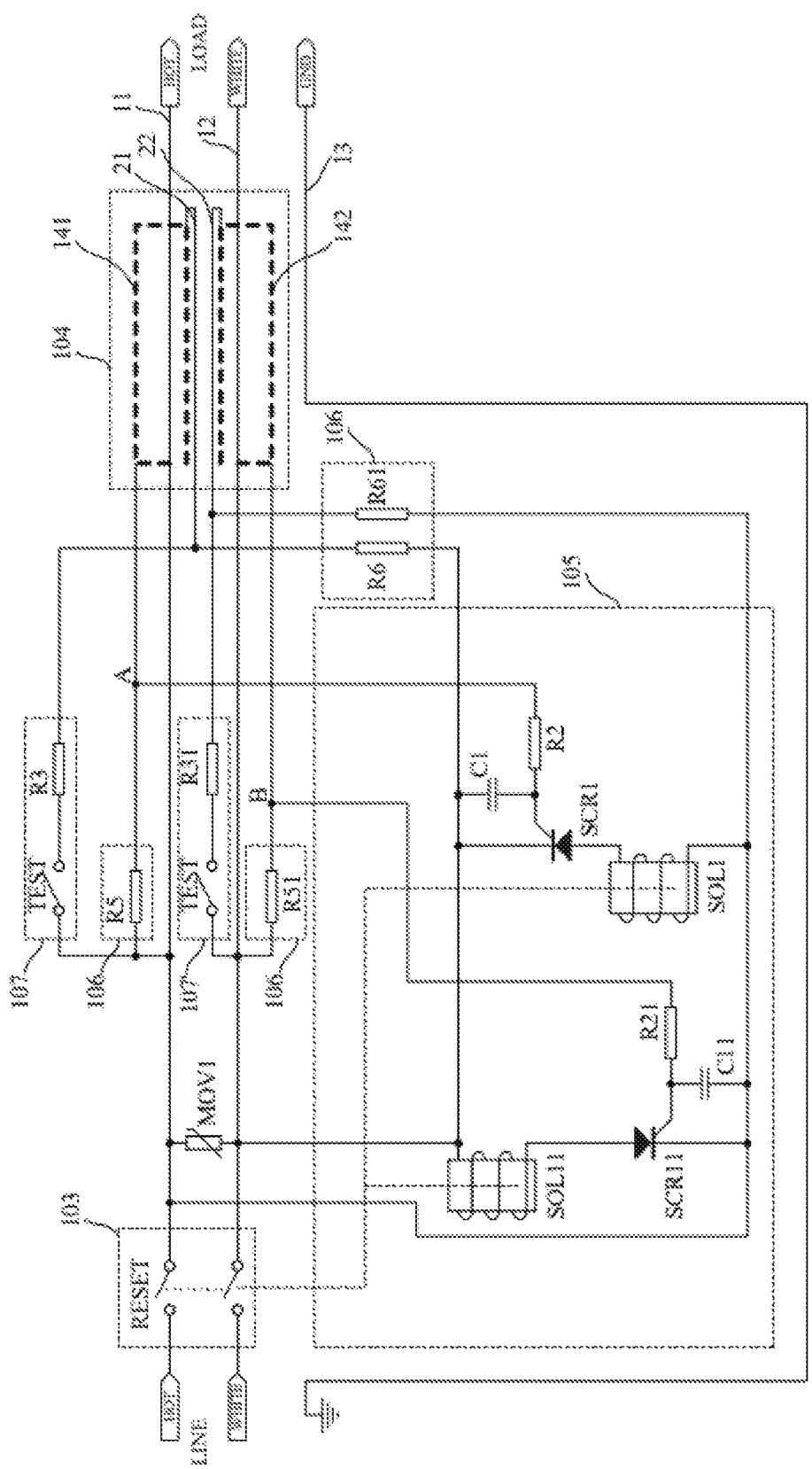
FIG. 2 is a circuit diagram of an LCDI device according to a first embodiment of the present invention.

FIG. 2 is a circuit diagram of an LCDI device according to a first embodiment of the present invention. The leakage current detection module 104 includes a first leakage current detection line 141, a second leakage current detection line 142, and first and second connector lines 21 and 22. The first leakage current detection line 141 covers the first power supply line 11, and the second leakage current detection line 142 covers the second power supply line 12. The first end of each of the first leakage current detection line 141, second leakage current detection line 142 and connector lines 21 and 22 is the end farther away from the load LOAD, i.e. on the left-hand side of FIG. 2, while the second end of each of these lines is the end closer to the load LOAD, i.e. on the right-hand side of FIG. 2.

The second end of the first leakage current detection line 141 is coupled to the second end of the first connector line 21, and the second end of the second leakage current detection line 142 is coupled to the second end of the second connector line 22. The first end of the first leakage current detection line 141 is coupled to one end of resistor R5 of the self-test module 106 at point A. The first end of the second leakage current detection line 142 is coupled to one end of resistor R51 of the self-test module 106 at point B. The first end of the first connector line 21 is coupled between resistors R3 and R6, and the first end of the second connector line 22 is coupled between resistors R31 and R61. In the drive module 105, a resistor R2 is coupled between point A and the control electrode of a first silicon controlled rectifier SCR1 (first semiconductor device), and a resistor R21 is coupled between point B and the control electrode of a second silicon controlled rectifier SCR11 (second semiconductor device). A capacitor C1 is coupled between the control electrode and cathode of the first silicon controlled rectifier SCR1, and a capacitor C11 is coupled between the control electrode and cathode of the second silicon controlled rectifier SCR11.

The anode of the first silicon controlled rectifier SCR1 is coupled to the first power supply line 11 via the first solenoid SOL1, and the cathode of the first silicon controlled rectifier SCR1 is coupled to the second power supply line 12. The anode of the second silicon controlled rectifier SCR11 is coupled to the second power supply line 12 via the second solenoid SOL11, and the cathode of the second silicon controlled rectifier SCR11 is coupled to the first power supply line 11. In other words, the first silicon controlled rectifier SCR1 and second silicon controlled rectifier SCR11 are coupled between the first power supply line 11 and second power supply line 12 in opposite directions, so that currents flow through them in opposite directions. When the first silicon controlled rectifier SCR1 is conductive, a current flows from the first power supply line 11 to second power supply line 12; when the second silicon controlled rectifier SCR11 is conductive, a current flows from the second power supply line 12 to first power supply line 11.

When the first leakage current detection line 141, second leakage current detection line 142 and the two connector lines 21 and 22 all function normally (i.e., no open circuit conditions), a current can flow from the first power supply line 11 through a current path formed by R5-141-21-R6 to the second power supply line 12. By setting the resistance values of resistors R5 and R6, the voltage at point A is limited to a relatively low level, insufficient to trigger the first silicon controlled rectifier SCR1 via resistor R2. Similarly, a current can flow from the second power supply line 12 through a current path formed by R51-142-22-R61 to the first power supply line 11. By setting the resistance values of resistors R51 and R61, the voltage at point B is limited to a relatively low level, insufficient to trigger the second silicon controlled rectifier SCR11 via resistor R21. In this condition, the switch module 103 is closed, and the power cord conducts power normally.

When the first power supply line 11 has a leak to the first leakage current detection line 141, a leakage current (first leakage current signal) flows from the first power supply line 11 through 141-R2, the voltage at point A rises, which triggers the silicon controlled rectifier SCR1 to conduct. As a result, a sufficiently large current flows in the current path from the first power supply line 11 to second power supply line 12 through the first solenoid SOL1 and first silicon controlled rectifier SCR1, which generates a sufficiently large magnetic field to trip the reset switch RESET of the switch module 103, thereby cutting off the electrical connection from the input end LINE to output end LOAD. Similarly, when the second power supply line 12 has a leak to second leakage current detection line 142, a leakage current (second leakage current signal) flows from the second power supply line 12 through 142-R21, the voltage at point B rises, which triggers the second silicon controlled rectifier SCR11 to conduct. As a result, a sufficiently large current flows in the current path from the second power supply line 12 to first power supply line 11 through the first solenoid SOL11 and second silicon controlled rectifier SCR11, which generates a sufficiently large magnetic field to trip the reset switch RESET of the switch module 103, thereby cutting off the electrical connection from the input end LINE to output end LOAD. Therefore, the LCDI device can independently detect the first and second leakage current signals caused by leaks on the first and second power supply lines 11 and 12.

When the first leakage current detection line 141 has an open circuit condition, resistor R6 loses its voltage regulation function for point A, the voltage at point A rises due to a current flow (first self-test fault signal) from the first power supply line 11 through R5-R2, which triggers the first silicon controlled rectifier SCR1 to conduct. As a result, a sufficiently large current flows in the current path from the first power supply line 11 to second power supply line 12 through the first solenoid SOL1 and first silicon controlled rectifier SCR1, which generates a sufficiently large magnetic field to trip the reset switch RESET of the switch module 103, thereby cutting off the electrical connection from the input end LINE to output end LOAD. Similarly, when the second leakage current detection line 142 has an open circuit condition, resistor R61 loses its voltage regulation function for point B, the voltage at point B rises due to a current flow (second self-test fault signal) from the second power supply line 12 through R51-R21, which triggers the second silicon controlled rectifier SCR11 to conduct. As a result, a sufficiently large current flows in the current path from the second power supply line 12 to first power supply line 11 through the first solenoid SOL11 and second silicon controlled rectifier SCR11, which generates a sufficiently large magnetic field to trip the reset switch RESET of the switch module 103, thereby cutting off the electrical connection from the input end LINE to output end LOAD. Therefore, the LCDI device can independently detect fault conditions of the first and second leakage current detection lines 141 and 142.

In addition to the self-test module 106, the test modules 107 and 107' can also test faults in the leakage current detection module 104. In this embodiment, the first test module 107 includes a first test switch TEST, and the second test module 107' includes a second test switch TEST. For the first test module 107, a test current path is formed from 11-TEST-R3-21-141-R2-SCR1-12. For the second test module 107', a test current path is formed from 12-TEST-R31-22-142-R21-SCR11-11.

When the first leakage current detection line 141, the second leakage current detection line 142 and the two connector lines 21 and 22 all function normally and there is no leakage current either between the first power supply line 11 and the first leakage current detection line 141 or between the second power supply line 12 and the second leakage current detection line 142, the silicon controlled rectifiers SCR1 and SCR11 are not triggered, and the power cord conducts power normally.

In this normal condition, when the user depresses the first test switch TEST of the first test module 107, a current flows through the test current path 11-TEST-R3-21-141-R2-SCR1-12, triggering the first silicon controlled rectifier SCR1 to conduct. As a result, a sufficiently large current flows through the first solenoid SOL1, which generates a sufficiently large magnetic field to trip the reset switch RESET of the switch module 103, thereby cutting off the electrical connection to the LOAD. If the RESET switch is not tripped in response to operating the first TEST switch, it indicates that the LCDI device 100 is abnormal and has lost its protection function and needs to be replaced.

Similarly, in the normal condition, when the user depresses the second test switch TEST of the second test module 107', a current flows through the test current path 12-TEST-R31-22-142-R21-SCR11-11, triggering the second silicon controlled rectifier SCR11 to conduct. As a result, a sufficiently large current flows through the second solenoid SOL11, which generates a sufficiently large magnetic field to trip the reset switch RESET of the switch module 103, thereby cutting off the electrical connection to the LOAD. If the RESET switch is not tripped in response to operating the second TEST switch, it indicates to the LCDI device 100 is abnormal and has lost its protection function and needs to be replaced.

Figure 3:
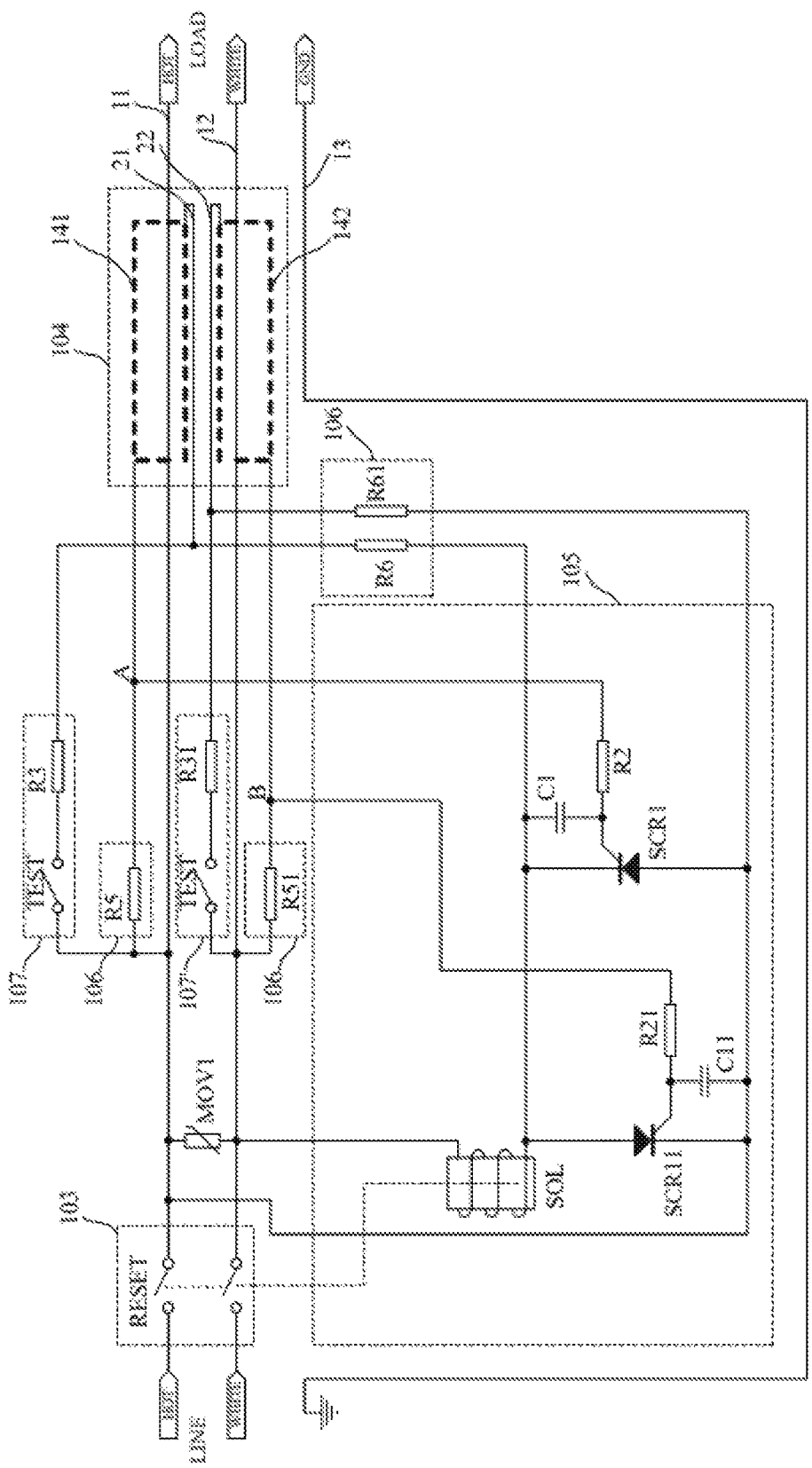
FIG. 3 is a circuit diagram of an LCDI device according to a second embodiment of the present invention.

FIG. 3 is a circuit diagram of an LCDI device according to a second embodiment of the present invention. Compared to the embodiment of FIG. 2, the main differences are in the circuit of the drive module 105. More specifically, the drive module 105 in FIG. 3 includes only one solenoid SOL. The anode of the first silicon controlled rectifier SCR1 is coupled to the first power supply line 11, and its cathode is coupled to the second power supply line 12 via the solenoid SOL. The anode of the second silicon controlled rectifier SCR11 is coupled to the second power supply line 12 via the solenoid SOL, and its cathode is coupled to the first power supply line 11. The operations of the LCDI device 100 of FIG. 3 are similar to those of the embodiments of FIG. 2 and further descriptions are omitted here.

In the above embodiments, each of the two leakage current detection lines covers one of the two power supply lines and forms a leakage current detection circuit with the drive module. Thus, they can individually detect current leakage fault on the two leakage current detection lines and individually detect open circuit fault on the two leakage current detection lines. The LCDI device according to embodiments of the present invention have a simple circuit structure, is low cost and reliable.

Figure 4A:
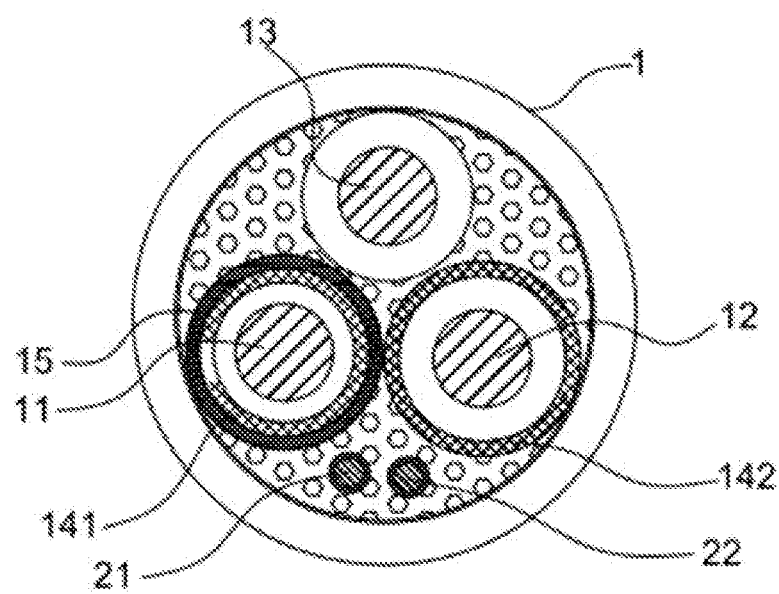
FIG. 4A is a cross-sectional view of a power cord according to an embodiment of the present invention.
Figure 4B:
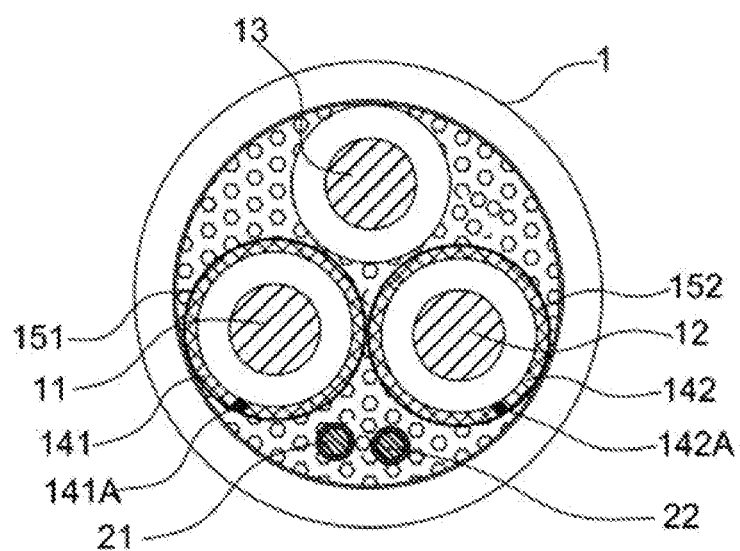
FIG. 4B is a cross-sectional view of a power cord according to another embodiment of the present invention.

FIG. 4A is a cross-sectional view of a power cord according to an embodiment of the present invention. FIG. 4B is a cross-sectional view of a power cord according to another embodiment of the present invention.

As shown in FIG. 4A, the power cord 1 includes the first power supply line 11 (e.g., hot line L), the second power supply line 12 (e.g. neutral line N), the third power supply line 13 (e.g. ground line G), the first leakage current detection line 141, the second leakage current detection line 142, and the first and second connector lines 21 and 22. The power cord 1 may be used in the LCDI devices of the embodiments of FIGS. 2-3. The first leakage current detection line 141 covers the first power supply line 11 with an insulating layer in between, and the second leakage current detection line 142 covers the second power supply line 12 with an insulating layer in between. As shown in FIG. 4A, the power cord 1 may further includes filling materials (filler). In the embodiment shown in FIG. 4A, the first leakage current detection line 141 is covered by an insulating layer 15, and the second leakage current detection line 142 is not covered by a separate insulating layer. In alternative embodiments, both the first leakage current detection line 141 and the second leakage current detection line 142 may be separately covered with insulating layers, or, the first leakage current detection line 141 is not covered by an insulating layer and second leakage current detection line 142 is covered by an insulating layer. The first leakage current detection line 141 and second leakage current detection line 142 may be formed of a metal (e.g. copper, aluminum, etc.) woven structure, or a wound structure formed of at least one metal wire, or a metal foil cover, or combinations of any one or more of the above. The second leakage current detection line 142 may be formed of a single-sided insulating material (i.e., a sheet material having one side being a conductive material and the other side being an insulating material) that covers the power supply line (with the conductive side facing in and insulating side facing out), so no separate insulating layer outside of the leakage current detection line is required.

The power cord 1 of FIG. 4B is different from that of FIG. 4A in that, in FIG. 4B, each of the first leakage current detection line 141 and second leakage current detection line 142 is formed of a single-sided insulating material (i.e., a sheet material having one side being a conductive material and the other side being an insulating material) that covers the respective power supply line (with the conductive side facing in and insulating side facing out), so no separate insulating layer outside of the leakage current detection line is required. The power cord 1 of FIG. 4B may be used in the LCDI devices of the embodiments of FIGS. 2-3. In this embodiment, a single-sided insulating material with an aluminum conductive side is used as the first leakage current detection line 141 and second leakage current detection line 142, and the insulating layers 151, 152 are the insulating sides of the respective single-sided insulating material. Two respective drain lines (conductors) 141A and 142A are enclosed inside of the conductive side of the respective single-sided insulating material.

Although in FIGS. 4A-4B the connector lines 21 and 22 are located below the first and second leakage current detection lines 141 and 142 in the illustrated orientation, it should be understood that the connector line may be located at any suitable locations within the cord. Further, although in FIGS. 4A-4B the exterior shape of the cross-section of the cord 1 is round, the exterior shape may alternatively be an elongated shape with the power supply lines arrange side-by-side, or other suitable shapes and arrangements.

Some additional embodiments of the present invention provide an electrical power connection device, which includes a body and an LCDI device according to any one of the above embodiments disposed inside the body.

Other additional embodiments of the present invention provide an electrical appliance, which includes an electrical load, and an electrical power connection device coupled between a power supply and the load to supply power to the load, where the electrical power connection device employs an LCDI device according to any one of the above embodiments.

While the present invention is described above using specific examples, these examples are only illustrative and do not limit the scope of the invention. It will be apparent to those skilled in the art that various modifications, additions and deletions can be made to the leakage current detection and interruption device of the present invention without departing from the spirit or scope of the invention.

What is claimed is:

1. A leakage current detection and interruption device for a power cord, comprising:
   a first power supply line and a second power supply line;
   a switch module, configured to control an electrical connection of the first power supply line and second power supply line between an input end and an output end;
   a leakage current detection module, including a first leakage current detection line and a second leakage current detection line, wherein the first leakage current detection line is configured to detect a first leakage current signal on the first power supply line and to generate a first self-test fault signal in response to the first leakage current detection line having an open circuit, and wherein the second leakage current detection line is configured to detect a second leakage current signal on the second power supply line and to generate a second self-test fault signal in response to the second leakage current detection line having an open circuit; and
   a drive module, coupled to the switch module and the leakage current detection module, including:
      at least one solenoid; and
      a first semiconductor device and a second semiconductor device,
      wherein the first semiconductor device is configured to, in response to the first leakage current signal and/or the first self-test fault signal, become conductive to form a first current path from the first power supply line to the second power supply line to supply current to the at least one solenoid, and wherein the at least one solenoid is configured to, in response to the current flowing through it, generate an electromagnetic force to drive the switch module to disconnect the electrical connection, and
      wherein the second semiconductor device is configured to, in response to the second leakage current signal and/or the second self-test fault signal, become conductive to form a second current path from the second power supply line to the first power supply line to supply current to the at least one solenoid, and wherein the at least one solenoid is configured to, in response to the current flowing through it, generate an electromagnetic force to drive the switch module to disconnect the electrical connection.

2. The leakage current detection and interruption device of claim 1, wherein the first semiconductor device is a first silicon controlled rectifier, the second semiconductor device is a second silicon controlled rectifier, wherein an anode of the first silicon controlled rectifier is couple to the first power supply line, a cathode of the first silicon controlled rectifier is couple to the second power supply line, an anode of the second silicon controlled rectifier is couple to the second power supply line, and a cathode of the second silicon controlled rectifier is couple to the first power supply line.

3. The leakage current detection and interruption device of claim 1, further comprising:
   a self-test module, coupled to the leakage current detection module, the drive module, the first power supply line, and the second power supply line, and configured to:
      detect whether an open circuit is present on at least one of the first and second leakage current detection lines; and
      cooperate with the first leakage current detection line to generate the first self-test fault signal when the first leakage current detection line has an open circuit, and cooperate with the second leakage current detection line to generate a second self-test fault signal when the second leakage current detection line has an open circuit.

4. The leakage current detection and interruption device of claim 1, wherein the first leakage current detection line and second leakage current detection line are electrically insulated from each other by an insulating structure.

5. The leakage current detection and interruption device of claim 1, wherein each of the first and second semiconductor devices is selected from a group consisting of: silicon controlled rectifiers, bipolar junction transistors, field-effect transistors, and photoelectric coupling elements.

6. The leakage current detection and interruption device of claim 1, further comprising:
   at least one test module, including a test switch coupled to the leakage current detection module,
   wherein the drive module is further configured to drive the switch module to disconnect the electrical connection in response to the test switch being manually operated and the leakage current detection module having no open circuit.

7. The leakage current detection and interruption device of claim 6, wherein one end of the test switch is coupled to the first leakage current detection line or the second leakage current detection line, and another end of the test switch is coupled to the first power supply line or the second power supply line.

8. The leakage current detection and interruption device of claim 6, wherein the at least one self-test module includes a first test module and a second test module, the first test module including a first test switch, the second test module including a second test switch,
   wherein one end of the first test switch is coupled to the first leakage current detection line and another end of the first test switch is coupled to the first power supply line, and one end of the second test switch is coupled to the second leakage current detection line and another end of the second test switch is coupled to the second power supply line.

9. The leakage current detection and interruption device of claim 1, wherein first and second power supply lines respectively include an insulating cover, and wherein the first and second leakage current detection lines respectively cover the first and second power supply lines outside of the respective insulating cover.

10. An electrical power connection device, comprising:
    a body; and
    a leakage current detection and interruption device of claim 1, disposed inside the body.

11. An electrical appliance, comprising:
    an electrical load; and
    an electrical power connection device coupled between a power supply and the electrical load, configured to supply power to the electrical load, wherein the electrical power connection device includes a leakage current detection and interruption device of claim 1.

* * * * *